(12) United States Patent
Adachi et al.

(10) Patent No.: US 11,483,928 B2
(45) Date of Patent: Oct. 25, 2022

(54) FLEXIBLE PRINTED CIRCUIT BOARD

(71) Applicants: SUMITOMO ELECTRIC PRINTED CIRCUITS, INC., Shiga (JP); SUMITOMO ELECTRIC INDUSTRIES, LTD., Osaka (JP)

(72) Inventors: Yoshiro Adachi, Shiga (JP); Yoshifumi Uchita, Shiga (JP); Yoshio Oka, Osaka (JP)

(73) Assignees: SUMITOMO ELECTRIC PRINTED CIRCUITS, INC., Shiga (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 36 days.

(21) Appl. No.: 16/631,273

(22) PCT Filed: Aug. 3, 2018

(86) PCT No.: PCT/JP2018/029167
§ 371 (c)(1),
(2) Date: Jan. 15, 2020

(87) PCT Pub. No.: WO2019/035370
PCT Pub. Date: Feb. 21, 2019

(65) Prior Publication Data
US 2020/0214129 A1 Jul. 2, 2020

(30) Foreign Application Priority Data
Aug. 14, 2017 (JP) .............................. JP2017-156500

(51) Int. Cl.
*H05K 1/02* (2006.01)
*H05K 1/03* (2006.01)
(Continued)

(52) U.S. Cl.
CPC ............. *H05K 1/118* (2013.01); *H05K 1/184* (2013.01); *H05K 1/188* (2013.01);
(Continued)

(58) Field of Classification Search
CPC ... H05K 1/02; H05K 1/03; H05K 1/11; H05K 1/14; H05K 1/114; H05K 1/115;
(Continued)

(56) References Cited

U.S. PATENT DOCUMENTS 5,330,825 A 7/1994 Ouchi et al.
5,590,465 A 1/1997 Santo
(Continued)

FOREIGN PATENT DOCUMENTS

JP S62-042482 2/1987
JP H05-235498 9/1993
(Continued)

*Primary Examiner* — Xiaoliang Chen
(74) *Attorney, Agent, or Firm* — IPUSA, PLLC

(57) ABSTRACT

A flexible printed circuit board includes a base film having an insulating property and a conductive pattern laminated on one surface of the base film, and has a terminal connecting area toward one end edge of the conductive pattern, the flexible printed circuit board including a reinforcement member laminated on an opposite surface of the base film and situated at least at a position opposite the terminal connecting area, wherein the reinforcement member has one or more lines of hollow holes aligning with a width direction thereof.

5 Claims, 2 Drawing Sheets

(51) Int. Cl.
*H05K 1/11* (2006.01)
*H05K 1/14* (2006.01)
*H05K 3/00* (2006.01)
*H05K 3/07* (2006.01)
*H01R 12/00* (2006.01)
*H01R 12/59* (2011.01)
*H01R 12/61* (2011.01)
*H01R 12/62* (2011.01)
*H01R 12/73* (2011.01)
*H01R 12/78* (2011.01)
*H01R 12/79* (2011.01)
*H01R 12/88* (2011.01)
*H01R 13/58* (2006.01)
*H01R 13/62* (2006.01)
*H01R 13/64* (2006.01)
*H05K 1/18* (2006.01)

(52) U.S. Cl.
CPC .............. *H05K 2201/05* (2013.01); *H05K 2201/09445* (2013.01); *H05K 2201/1034* (2013.01)

(58) Field of Classification Search
CPC .......... H05K 1/189; H05K 3/00; H05K 3/007; H05K 3/365; H01R 12/00; H01R 12/24; H01R 12/59; H01R 12/61; H01R 12/62; H01R 12/73; H01R 12/78; H01R 12/79; H01R 12/88; H01R 12/613; H01R 12/772; H01R 13/58; H01R 13/62; H01R 13/64; H01R 13/6271
USPC ...... 361/749; 439/61, 67, 74, 325, 345, 374, 439/492, 493, 495, 586; 174/126.4, 250, 174/251, 254, 255, 261
See application file for complete search history.

(56) References Cited

U.S. PATENT DOCUMENTS

| | | | | |
|---|---|---|---|---|
| 6,166,888 A * | 12/2000 | Tsuda | ............ | H05K 1/189 360/264.2 |
| 6,176,734 B1 * | 1/2001 | Juntwait | ............ | H01R 12/62 439/493 |
| 6,320,135 B1 * | 11/2001 | Saito | ............ | H01L 23/4985 174/250 |
| 6,743,045 B1 * | 6/2004 | Hayashi | ............ | H01R 13/33 439/492 |
| 8,128,429 B2 | 3/2012 | Suzuki | | |
| 9,286,924 B1 * | 3/2016 | Akatsuka | ............ | G11B 5/4846 |
| 2002/0048156 A1 * | 4/2002 | Saito | ............ | H01L 23/4985 361/749 |
| 2004/0026363 A1 * | 2/2004 | Akamatsu | ............ | H05K 3/007 216/13 |
| 2004/0248450 A1 * | 12/2004 | Masaki | ............ | H01R 12/7082 439/325 |
| 2004/0248460 A1 * | 12/2004 | Masaki | ............ | H01R 12/89 439/492 |
| 2006/0068164 A1 * | 3/2006 | Iguchi | ............ | H01L 23/4985 428/131 |
| 2006/0116005 A1 * | 6/2006 | Yu | ............ | H05K 1/0281 439/67 |
| 2008/0295323 A1 * | 12/2008 | Tseng | ............ | H05K 1/0206 29/825 |
| 2009/0023324 A1 * | 1/2009 | Koike | ............ | H01R 12/87 439/345 |
| 2010/0252307 A1 * | 10/2010 | Mo | ............ | H05K 1/0281 174/254 |
| 2010/0291790 A1 * | 11/2010 | Kiryu | ............ | H01R 12/79 439/374 |
| 2011/0212631 A1 * | 9/2011 | Iida | ............ | H05K 3/365 439/74 |
| 2013/0002039 A1 * | 1/2013 | Kusamitsu | ............ | H04B 5/0012 307/104 |
| 2013/0028065 A1 * | 1/2013 | Kim | ............ | H05K 1/0281 369/100 |
| 2014/0017938 A1 * | 1/2014 | Iwano | ............ | H01R 12/79 439/586 |
| 2014/0043577 A1 * | 2/2014 | Kim | ............ | G02F 1/133305 349/150 |
| 2014/0073166 A1 * | 3/2014 | Kim | ............ | H01R 12/772 439/345 |
| 2014/0144678 A1 * | 5/2014 | Lin | ............ | H01R 12/592 174/254 |
| 2015/0102874 A1 * | 4/2015 | Chuo | ............ | H05K 1/024 333/246 |
| 2015/0136448 A1 * | 5/2015 | Sasaki | ............ | H05K 1/0281 174/251 |
| 2016/0198572 A1 * | 7/2016 | Ishida | ............ | H05K 1/113 439/629 |
| 2016/0204531 A1 * | 7/2016 | Ishida | ............ | H05K 1/117 439/65 |
| 2016/0204532 A1 * | 7/2016 | Ishida | ............ | H05K 1/028 439/61 |
| 2016/0204534 A1 * | 7/2016 | Ishida | ............ | H01R 12/88 439/61 |
| 2016/0211599 A1 * | 7/2016 | Ishida | ............ | H05K 1/111 |
| 2017/0034907 A1 * | 2/2017 | Iwase | ............ | H05K 1/095 |
| 2017/0181282 A1 * | 6/2017 | Ishida | ............ | H01R 12/77 |
| 2017/0303395 A1 * | 10/2017 | Ishida | ............ | H05K 1/0218 |
| 2017/0336584 A1 * | 11/2017 | Ariga | ............ | H05K 3/3447 |
| 2018/0019417 A1 * | 1/2018 | Andou | ............ | H05K 1/0269 |
| 2018/0027673 A1 * | 1/2018 | Andou | ............ | H01L 51/0097 361/749 |

FOREIGN PATENT DOCUMENTS

| | | |
|---|---|---|
| JP | H06-216487 | 8/1994 |
| JP | H06-232513 | 8/1994 |
| JP | 2005-294746 | 10/2005 |
| JP | 2010-239109 | 10/2010 |
| WO | 2010/004439 | 1/2010 |

* cited by examiner

FLEXIBLE PRINTED CIRCUIT BOARD

TECHNICAL FIELD

The disclosures herein relate to a flexible printed circuit board.

The present application claims priority to Japanese patent application No. 2017-156500 filed on Aug. 14, 2017, and the entire contents of the Japanese patent application are hereby incorporated by reference.

BACKGROUND ART

In recent years, various flexible printed circuit boards have been used in the field of electronic devices due to the need for size reduction and weight reduction of electronic devices. As such flexible printed circuit boards, a flexible printed circuit board is generally used that includes a base film serving as a base and a conductive pattern made of copper foil or the like laminated to the surface of the base film.

Such a flexible printed circuit board is flexible. For this reason, the connection terminals of a flexible printed circuit board for connection to a conductor pattern of an electronic device have a reinforcement plate serving as a reinforcement member and laminated on an outer face thereof, for example, for the purpose of preventing bending or warpage (see WO 2010/004439).

RELATED-ART DOCUMENTS

Patent Document

Patent Document 1: International Publication NO. 2010/004439

SUMMARY OF THE INVENTION

A flexible printed circuit board of the present disclosures includes a base film having an insulating property and a conductive pattern laminated on one surface of the base film, and has a terminal connecting area toward one end edge of the conductive pattern, the flexible printed circuit board including a reinforcement member laminated on an opposite surface of the base film and situated at least at a position opposite the terminal connecting area, wherein the reinforcement member has one or more lines of hollow holes aligning with a width direction thereof.

MODE FOR CARRYING OUT THE INVENTION

Figure 1:
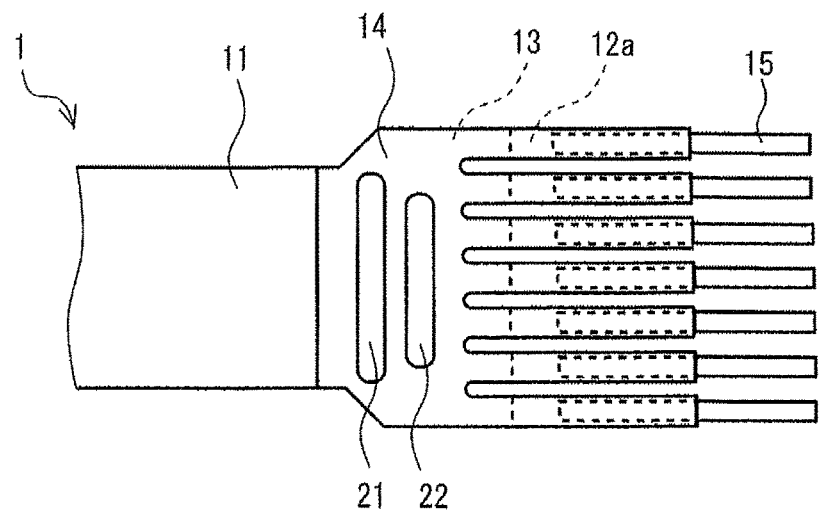
FIG. 1 is a schematic back-side view of a flexible printed circuit board according to an embodiment.

Problem to be Solved by the Present Disclosures

In a flexible printed circuit board reinforced by a reinforcement member, stress is likely to be concentrated on the boundary between the place where the reinforcement member is laminated and the place where the reinforcement member is not laminated. Fracture is thus likely to occur at this boundary.

Particularly noted is the fact that, with a recent progress in the size reduction of electronic devices, the conductive patterns of flexible printed circuit boards have become narrower and narrower, and, also, the bending radius of flexible printed circuit boards has become smaller and smaller. Because of this, a fracture in the conductive patterns of flexible printed circuit boards resulting from stress concentration has become a larger problem.

The present disclosures are made in consideration of the above-noted circumstances, and are directed to providing a flexible printed circuit board that can prevent fractures caused by stress concentration resulting from the presence of a reinforcement member.

Advantage of the Present Disclosures

The flexible printed circuit board of the present disclosures prevents fractures caused by stress concentration resulting from the presence of a reinforcement member.

DESCRIPTION OF EMBODIMENTS OF THE PRESENT DISCLOSURES

A flexible printed circuit board of the present disclosures includes a base film having an insulating property and a conductive pattern laminated on one surface of the base film, and has a terminal connecting area toward one end edge of the conductive pattern, the flexible printed circuit board including a reinforcement member laminated on an opposite surface of the base film and situated at least at a position opposite the terminal connecting area, wherein the reinforcement member has one or more lines of hollow holes aligning with a width direction thereof.

In the flexible printed circuit board, the reinforcement member has hollow holes aligning with the width direction thereof. The hollow holes are likely to disperse stress, so that the flexible printed circuit board may prevent fracture caused by stress concentration resulting from the presence of the reinforcement member.

The above-noted aligning hollow holes may be implemented as a plurality of round holes. Implementing the aligning hollow holes as a plurality of round holes in this manner effectively disperses stress while reducing the likelihood of weakening the reinforcement member.

The diameter of the round holes may be greater than or equal to 0.3 mm and less than or equal to 10 mm. Setting the diameter of round holes to greater than or equal to 0.3 mm and less than or equal to 10 mm in this manner allows a fracture preventive effect to be obtained while reducing the likelihood of weakening the reinforcement member.

The diameters of the round holes are preferably equal to each other. Setting the diameters of round holes equal to each other in this manner allows stress to be effectively dispersed.

The average intervals between the round holes in the width direction may be greater than or equal to 0.4 mm and less than or equal to 10 mm. Setting the average intervals between the round holes in the width direction to greater than or equal to 0.4 mm and less than or equal to 10 mm in this manner allows a fracture preventive effect to be obtained while reducing the likelihood of weakening the reinforcement member.

The reinforcement member may be provided with two lines of hollow holes which include first hollow holes and second hollow holes disposed alongside the first hollow holes toward the noted one end edge. When the reinforcement member is provided with two lines of hollow holes which include first hollow holes and second hollow holes disposed alongside the first hollow holes toward the noted one end edge, stress is more effectively dispersed, and, thus, the fracture preventive effect can be improved.

The value obtained by dividing the area of a smaller area hollow hole by the area of a larger area hollow hole, among the first hollow holes and the second hollow holes, may be greater than or equal to a factor of 0.3 or less than or equal to a factor of 1.0. When the value obtained by dividing the area of a smaller area hollow hole by the area of a larger area hollow hole, among the first hollow holes and the second hollow holes, is greater than or equal to a factor of 0.3 or less than or equal to a factor of 1.0, stress is more effectively dispersed, and, thus, the fracture preventive effect can be improved.

The average separation distance between the first hollow holes and the second hollow holes may be greater than or equal to 0.5 mm and less than or equal to 10 mm. When the average separation distance between the first hollow holes and the second hollow holes is greater than or equal to 0.5 mm and less than or equal to 10 mm, stress is more effectively dispersed, and, thus, the fracture preventive effect can be improved.

One or more connection terminals may be disposed on the terminal connecting area, and the connection terminals may be made of a metal. The effect to prevent stress concentration is particularly strong in the flexible printed circuit board when the connection terminals connected thereto are made of metal and have high stiffness.

Details of Embodiments of the Present Disclosures

In the following, embodiments of the flexible printed circuit board according to the present disclosures will be described with reference to the drawings.

First Embodiment

Figure 2:
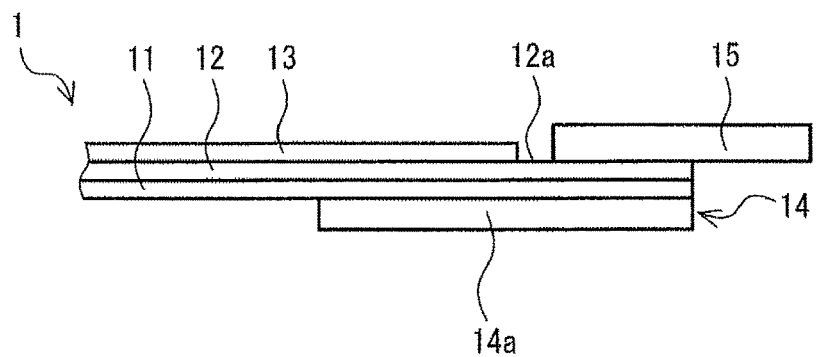
FIG. 2 is a schematic side-elevation view of the flexible printed circuit board of FIG. 1.

A flexible printed circuit board 1 according to an embodiment illustrated in FIG. 1 and FIG. 2 includes a base film 11 having an insulating property, a conductive pattern 12 laminated to one surface of the base film 11, a coverlay 13 laminated to the one surface of the base film 11 or conductive pattern 12, and a reinforcement member 14 laminated to the opposite surface of the base film 11. The flexible printed circuit board 1 has a terminal connecting area 12a toward one end edge of the conductive pattern 12, and has a plurality of connection terminals 15 on the terminal connecting area 12a.

<Base Film>

The base film 11 is a member that supports the conductive pattern 12, and is a structural material that secures the strength of the flexible printed circuit board 1.

The main component of the base film 11 may be a soft material such as polyimide, liquid crystal polymer such as liquid crystal polyester, polyethylene terephthalate, polyethylene naphthalate, polyphenylene ether, or fluorine resin, a hard material such as paper phenol, paper epoxy, a glass composite, glass epoxy, or a glass substrate, or a rigid flexible material composed of a soft material and a rigid material. Among these, polyimide is preferable due to its excellent heat resistance. The base film 11 may be porous, or may include fillers, additives, and the like.

Although the base film 11 is not limited to a particular thickness, the lower limit of the average thickness of the base film 11 is preferably 5 μm and more preferably 12 μm. The upper limit of the average thickness of the base film 11 is preferably 500 μm and more preferably 200 μm. Use of an average thickness of the base film 11 that is less than the lower limit may create a risk that the strength of the base film 11 is insufficient. Use of an average thickness of the base film 11 that exceeds the upper limit may create a risk that the flexibility of the flexible printed circuit board 1 is insufficient.

<Conductive Pattern>

The conductive pattern 12 constitutes structures such as an electrical interconnect structure, the ground, shields, and the like.

The conductive pattern 12 is not limited to a particular material as long as the material has electrical conductivity. Examples include metals such as copper, aluminum, and nickel. In general, copper is used due to its relatively low price and high conductivity. The conductive pattern 12 may also be plated on the surface thereof.

The lower limit of the average thickness of the conductive pattern 12 is preferably 2 μm and more preferably 5 μm. The upper limit of the average thickness of the conductive pattern 12 is preferably 100 μm and more preferably 70 μm. Use of an average thickness of the conductive pattern 12 that is less than the lower limit may create a risk that the conductivity of the conductive pattern 12 is insufficient. Conversely, use of an average thickness of the conductive pattern 12 that exceeds the upper limit may create a risk that the flexible printed circuit board 1 is needlessly thick.

The terminal connecting area 12a of the flexible printed circuit board 1 situated toward the one end edge of the conductive pattern 12 is an area for use in connection with another electronic device through the connection terminals 15, which will be described later. In the terminal connecting area 12a, the coverlay 13, which will be described later, is not provided.

The terminal connecting area 12a has a comb shape with the teeth extending toward the noted one end edge as illustrated in FIG. 1. Each tooth portion of the comb is provided with one connection terminal 15. As described above, the shape of the flexible printed circuit board 1 at the above-noted terminal connecting area 12a may be configured into a comb shape, which makes it less likely for stress applied to the terminal connecting area 12a by any given connection terminal 15 to be applied to the terminal connecting area 12a of adjacent connection terminals 15. This reduces stress applied through the connection terminals 15 to the flexible printed circuit board 1.

The size of each tooth portion of the terminal connecting area 12a is determined by the size of the connection terminals 15, and may have an average width of 0.5 mm or more and 3 mm or less and an average length of 3 mm or more and 50 mm or less. The number of tooth portions is determined in accordance with the number of connection terminals 15. Normally, the width of the base film 11 including the terminal connecting area 12a is constant. Depending on the number of connection terminals 15, however, the width of the base film 11 outside the above-noted terminal connecting area 12a may not be sufficient. In such a case, as illustrated in FIG. 1, for example, a required number of tooth portions is secured by widening the base film 11 toward the one end edge.

<Coverlay>

The coverlay 13 protects the conductive pattern 12 from external forces, moisture, and the like. The coverlay 13 includes a cover film and an adhesive layer. The coverlay 13 is implemented as the cover film laminated through this adhesive layer to the opposite surface of the conductive pattern 12 from the base film 11.

(Cover Film)

The cover film is not limited to a particular material, and the same or similar material as a resin constituting the base film 11 may be used, for example.

The lower limit of the average thickness of the cover film is preferably 5 µm and more preferably 10 µm. The upper limit of the average thickness of the cover film is preferably 50 µm and more preferably 30 µm. Use of an average thickness of the cover film that is less than the lower limit may create a risk of insufficient insulation. Conversely, use of an average thickness of the cover film that exceeds the upper limit may create a risk that the flexibility of the flexible printed circuit board 1 is undermined.

(Adhesive Layer)

The adhesive layer serves to secure the cover film on the conductive pattern 12 and on the base film 11. The adhesive layer is not limited to a particular material as long as the material is capable of securing the cover film on the conductive pattern 12 and on the base film 11. Excellent flexibility and excellent heat resistance are preferable property, and examples include polyimide, polyamide, epoxy, butyral, acrylic, and the like. Further, a thermosetting resin is preferable in terms of heat resistance.

Although the adhesive layer of the coverlay 13 is not limited to a particular average thickness, the lower limit of the average thickness of the adhesive layer is preferably 5 µm and more preferably 10 µm, for example. Further, the upper limit of the average thickness of the adhesive layer is 100 µm and more preferably 80 µm, for example. Use of an average thickness of the adhesive layer that is less than the lower limit may create a risk of insufficient adhesion. Conversely, use of an average thickness of the adhesive layer that exceeds the upper limit may create a risk that the flexibility of the flexible printed circuit board 1 is undermined.

<Reinforcement Member>

The reinforcement member 14 is laminated on the opposite surface of the base film 11 and situated at least at a position opposite the terminal connecting area 12a. The reinforcement member 14 is constituted by a reinforcement plate 14a. The reinforcement member 14 includes a first hollow hole 21 and a second hollow hole 22 disposed alongside the first hollow hole 21 toward the noted one end edge. The first hollow hole 21 and the second hollow hole 22 form two lines aligning with the width direction of the reinforcement member 14.

The reinforcement member 14 is made of a material having excellent mechanical strength. Especially, a material having a resin as a main component may be suitable as the material of the reinforcement member 14. The use of the reinforcement member 14 having a resin as a main component enables the reinforcement of the flexible printed circuit board 1 while securing flexibility. Examples of the above-noted resin include epoxy resin, polyester, polyimide, and the like. Further, as the material of the reinforcement member 14, a resin reinforced with glass fibers or paper such as a glass epoxy resin may be used. Herein, the term "main component" refers to a component accounting for the highest content, and refers to a component with a content of 50 wt % or more.

The end edge, situated toward the noted opposite end edge, of the reinforcement plate 14a constituting the reinforcement member 14 may not overlap, in a plan view, the end edge of the coverlay 13 situated toward the noted one end edge. Further, the end edge of the reinforcement plate 14a situated toward the noted opposite end edge may be positioned further toward the direction of the noted opposite end edge than is the end edge of the coverlay 13 situated toward the noted one end edge. Positioning the end edge of the reinforcement plate 14a situated toward the noted opposite end edge in such an arrangement serves to more reliably protect the portion that is likely to receive stress.

The lower limit of the average thickness (i.e., the average thickness of the reinforcement plate 14a) is preferably 5 µm and more preferably 15 µm. The upper limit of the average thickness of the reinforcement member 14 is preferably 500 µm and more preferably 400 µm. Use of an average thickness of the reinforcement member 14 that is less than the above-noted lower limit results in the failure to provide a sufficient reinforcement effect, thereby creating a risk that the flexible printed circuit board 1 is likely to exhibit bending and/or warpage. Conversely, use of an average thickness of the reinforcement member 14 that exceeds the upper limit creates a risk that the flexible printed circuit board 1 is needlessly thick.

The first hollow hole 21 and the second hollow hole 22 are each an oblong shape, with rounded opposite ends, extending longer in the width direction of the reinforcement member 14, and penetrate through the reinforcement plate 14a. The first hollow hole 21 and the second hollow hole 22 may each be disposed such that the central axis of a hollow hole extending in the longitudinal direction of the reinforcement member 14 (i.e., the direction perpendicular to the width direction) coincides with the central axis of the reinforcement member 14 extending in the longitudinal direction thereof.

The average length of the first hollow hole 21 and the second hollow hole 22 (i.e., the length in the width direction of the reinforcement member 14) is determined in accordance with the size of the flexible printed circuit board 1 and the stress applied thereto. The lower limit of the average length of the first hollow hole 21 and the second hollow hole 22 is preferably 3 mm and more preferably 5 mm. The upper limit of the average length of the first hollow hole 21 and the second hollow hole 22 is preferably 80 mm and more preferably 60 mm. Use of an average length of the first hollow hole 21 and the second hollow hole 22 that is less than the lower limit may create a risk of an insufficient fracture preventive effect. Conversely, use of an average length of the first hollow hole 21 and the second hollow hole 22 that exceeds the upper limit may create a risk that the strength of the reinforcement plate 14a is insufficient.

The lower limit of the average width of the first hollow hole 21 and the second hollow hole 22 (i.e., the length in the direction perpendicular to the width direction of the reinforcement member 14) is preferably 0.05 mm and more preferably 0.5 mm. The upper limit of the average width of the first hollow hole 21 and the second hollow hole 22 is preferably 10 mm and more preferably 5 mm. Use of an average width of the first hollow hole 21 and the second hollow hole 22 that is less than the lower limit may create a risk of an insufficient fracture preventive effect. Conversely, use of an average width of the first hollow hole 21 and the second hollow hole 22 that exceeds the upper limit may create a risk that the strength of the reinforcement plate 14a is insufficient.

The area of the first hollow hole 21 and the area of the second hollow hole 22 may be determined such that the stiffness gradually increases toward one end edge of the base film 11. In the case of the width of the base film 11 being constant, for example, the portion of the base film 11 where the reinforcement member 14 is laminated and the portion of the base film 11 where the reinforcement member is not laminated are such that the laminated portion has a higher stiffness, and the non-laminated portion has a lower stiffness. As the size of the hollow holes increases, the stiffness of the base film 11 decreases. Because of this, provision may be made such that the hollow hole closer to the one end edge of the base film 11 has a smaller area, thereby allowing the stiffness of the base film 11 to be controlled to increase toward the one end edge. It may also be noted that, when the width of the base film 11 increases toward the one end edge as illustrated in FIG. 1, for example, the stiffness of the base film 11 tends to increase toward the one end edge. Because of this, when ensuring that the stiffness of the base film 11 gradually increases toward the one end edge, there may be circumstances in which the areas of hollow holes need to be substantially equal to each other, or the areas of hollow holes need to be increased toward the one end edge of the base film 11. In any case, the areas of hollow holes may be determined such that the stiffness of the base film 11 gradually increases toward the one end edge of the base film 11, thereby more effectively dispersing stress, and improving the fracture preventive effect.

The lower limit of the ratio between the areas of adjacent hollow holes (i.e., the first hollow hole 21 and the second hollow hole 22 in the case of FIG. 1) is preferably a factor of 0.3 and more preferably a factor of 0.4. Use of an area ratio that is less than the lower limit may create a risk that a change in the stiffness is excessively large, resulting in an insufficient effect of the fracture prevention improvement. The upper limit of the ratio between the areas of adjacent hollow holes is not limited, and may be a factor of 1.0. The above-noted area ratio refers to a value obtained by dividing the area of a hollow hole having a smaller area by the area of a hollow hole having a larger area among the adjacent hollow holes.

The lower limit of the average separation distance between the first hollow hole 21 and the second hollow hole 22 is preferably 0.5 mm and more preferably 1 mm. Further, the upper limit of the average separation distance is preferably 10 mm and more preferably 5 mm. Use of an average separation distance that is less than the lower limit may create a risk of insufficient strength of the reinforcement plate 14a. Conversely, use of an average separation distance that exceeds the upper limit may create a risk of an insufficient fracture preventive effect. It may be noted that the average separation distance between the first hollow hole and the second hollow hole refers to the average width of a portion of the reinforcement plate 14a interposed between the first hollow hole and the second hollow hole.

Contact between the reinforcement plate 14a and the base film 11 may be secured through an adhesive layer, for example. In the case of securing the reinforcement plate 14a through an adhesive layer, the adhesive layer is not limited to a particular material as long as the material is capable of securing the reinforcement plate 14a. The same or similar material as the one used for securing the cover film may be used. The lower limit of an average thickness of the adhesive layer is preferably 5 µm and more preferably 10 µm. Further, the upper limit of an average thickness of the adhesive layer is preferably 100 µm and more preferably 70 µm. Use of an average thickness of the adhesive layer that is less than the lower limit may create a risk of insufficient adhesion with respect to the reinforcement member 14. Conversely, use of an average thickness of the adhesive layer that exceeds the upper limit may create a risk that the flexible printed circuit board 1 is needlessly thick.

<Connection Terminal>

The connection terminal 15 is a component for connecting the flexible printed circuit board 1 with another electronic device or the like.

The connection terminals 15 are not limited to a particular material as long as the material is electrically conductive. It may suffice for the connection terminals 15 to be made of a metal. The effect to prevent stress concentration is particularly high with respect to the flexible printed circuit board 1 connected with the high-stiffness connection terminals 15 made of a metal. Examples of the above-noted metal include soft copper, brass, phosphor bronze, and the like. The surface of the connection terminals 15 is preferably plated to prevent oxidation. The above-described plating may be Sn plating, Ni plating, Au plating, or the like. Among these, Ni plating, which is low cost and excellent in corrosion resistance, is preferable.

The shape of the above-described connection terminals 15 is determined in accordance with the shape of the terminal of the electronic device or the like that is to be coupled. The shape may be a plate shape or molded three dimensional shape having an average width of 0.5 mm to 3 mm inclusive, an average length of 3 mm to 50 mm inclusive, and an average height of 0.1 mm to 3 mm inclusive. The three-dimensional shape may be a rectangular parallelepiped or a shape made by connecting multiple, different size rectangular parallelepipeds in series along the longitudinal direction of the connection terminals 15, for example.

The connection terminals 15 are mounted on the terminal connecting area 12a to be electrically connected to the conductive pattern 12.

<Method of Making Flexible Printed Circuit Board>

The flexible printed circuit board 1 may be made by a production method including a step of forming a flexible printed circuit board core, a step of forming a reinforcement member, and a step of mounting connection terminals.

(Step of Forming Flexible Printed Circuit Board Core)

In the step of forming a flexible printed circuit board core, a flexible printed circuit board core is formed that includes a base film 11 having an insulating property, a conductive pattern 12 laminated on one surface of the base film 11, and a coverlay 13 laminated on the one surface of the base film 11 or the conductive pattern 12. The specific procedure is as follows.

A conductive layer is formed on one surface of the base film 11.

The conductor layer may be formed by bonding a conductor foil through an adhesive or by a deposition method known in the art, for example. Examples of the conductor include copper, silver, gold, nickel, and the like. The adhesive is not limited to any particular adhesive as long as the adhesive is capable bonding the conductor to the base film 11, and various adhesives known in the art may be used. Examples of the deposition method include vapor deposition, plating, and the like. The conductor layer is preferably formed by bonding a copper foil to the base film 11 through a polyimide adhesive.

The conductive layer is then patterned to form a conductive pattern 12.

Patterning of the conductor layer may be performed by a method known in the art, such as photoetching. Photoetching is performed by forming a resist film with a predetermined pattern on one surface of the conductive layer, by subsequently treating the conductive layer exposed from the resist film with an etchant, and by removing the resist film.

Finally, the coverlay 13 is laminated to cover the conductive pattern 12, except for the terminal connecting area 12a situated on the same side as the one end edge of the conductive pattern 12. Specifically, an adhesive layer is laminated to the surface of the base film 11 having the conductive pattern 12 formed thereon, and a cover film is laminated on the adhesive layer. Alternatively, an adhesive layer may be pre-laminated to the cover film, and the surface of the cover film having the adhesive layer laminated thereon is placed in contact with, and bonded to, the conductive pattern 12.

Bonding of the cover film through an adhesive is typically effected by thermal compression bonding. The temperature and pressure at the time of thermal compression bonding may be determined depending on the type and composition of the adhesive used. This thermal compression bonding may be performed together with the thermal compression bonding of the reinforcement member 14 performed in the step of forming the reinforcement member which will be described below.

(Step of Forming Reinforcement Member)

The step of forming a reinforcement member laminates the reinforcement member 14 on the opposite surface of the base film 11 of the flexible printed circuit board core. The reinforcement member of the flexible printed circuit board 1 is constituted by the reinforcement plate 14a.

The reinforcement plate 14a is pre-processed such that the first hollow hole 21 and the second hollow hole 22 are provided. The above-noted fabrication method is not limited to a particular method, and may, for example, involve punching based on a press mold.

The fabricated reinforcement plate 14a is laminated on the opposite surface of the base film 11. The method of lamination may involve disposing an adhesive layer on the surface of the reinforcement plate 14a, for example, and laminating the reinforcement plate 14a on the opposite surface of the base film 11 via the adhesive layer. The reinforcement plate 14a is then thermally bonded by pressure and heat. This thermal compression bonding may be utilized to perform the thermal compression bonding of the coverlay 13 at the same time.

(Step of Mounting Connection Terminals)

The step of mounting connection terminals serves to mount the connection terminals 15 on the terminal connecting area 12a. The method of mounting the connection terminals 15 is not limited to a particular method as long as the connection terminals 15 are secured on the terminal connecting area 12a with electrical conduction enabled therebetween. For example, the employed method may involve disposing solders on the terminal connecting area 12a of the conductive pattern 12, placing the ends of the connection terminals 15 on the solder, and melting the solder for reflow soldering to solder the connection terminals 15 to the conductive pattern 12, or may involve swaging the base film 11 for each connection terminal 15 for connection, or may involve pressing the connection terminals 15 from above for compression bonding to the terminal connecting area 12a while establishing electrical connection, or may involve connecting the connection terminals 15 to the conductive pattern 12 via an electrically conductive adhesive. Through such means, the connection terminals 15 are mounted, so that the flexible printed circuit board 1 is made.

<Advantage>

In the flexible printed circuit board 1, the reinforcement member 14 has hollow holes aligning with the width direction thereof. The hollow holes are likely to disperse stress, so that the flexible printed circuit board 1 may prevent fracture caused by stress concentration resulting from the presence of the reinforcement member 14.

Second Embodiment

Figure 3:
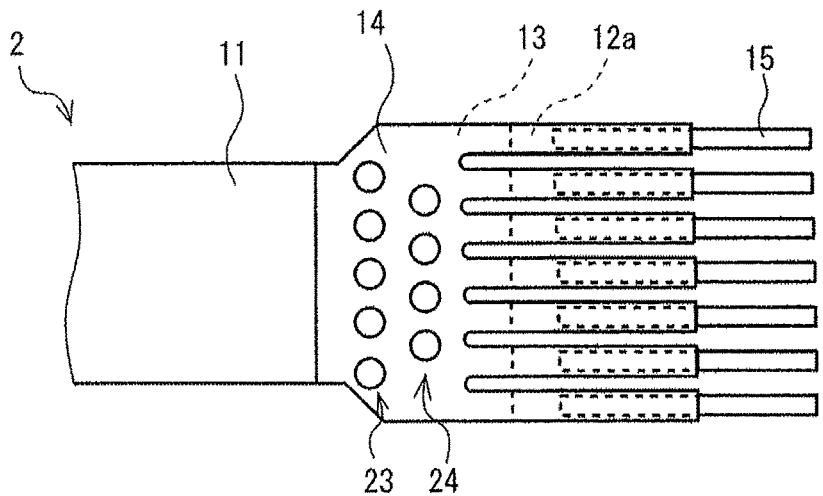
FIG. 3 is a schematic back-side view of a flexible printed circuit board according to an embodiment different from FIG. 1.

FIG. 3 illustrates a flexible printed circuit board 2 according to an embodiment different from FIG. 1. The flexible printed circuit board 2 includes a base film 11 having an insulating property, a conductive pattern 12 laminated to one surface of the base film 11, a coverlay 13 laminated to the one surface of the base film 11 or conductive pattern 12, and a reinforcement member 14 laminated to the opposite surface of the base film 11. The flexible printed circuit board 2 has a terminal connecting area 12a toward one end edge of the conductive pattern 12, and has a plurality of connection terminals 15 on the terminal connecting area 12a.

The configuration of the base film 11, the conductive pattern 12, the coverlay 13, and the connection terminals 15 for the flexible printed circuit board 2 of FIG. 3 may be the same as or similar to the configuration of the base film 11, the conductive pattern 12, the coverlay 13, and the connection terminals 15 for the flexible printed circuit board 1 of FIG. 1, respectively. Further, the configuration of the reinforcement member 14 for the flexible printed circuit board 2 of FIG. 3 is the same as or similar to the configuration of the reinforcement member 14 for the flexible printed circuit board 1 of FIG. 1, except for features relating to the shape of hollow holes as described below. The flexible printed circuit board 2 of FIG. may be made by the same or similar production method for the flexible printed circuit board 1 of FIG. 1. In consideration of the above, the duplicate descriptions of the flexible printed circuit board 2 illustrated in FIG. 3 which overlap the descriptions of the flexible printed circuit board 1 of FIG. 1 will omitted. In the following, the shape of hollow holes in the reinforcement member 14 which differs in configuration will mainly be described.

<Reinforcement Member>

In the flexible printed circuit board 2, first hollow holes 23 and second hollow holes 24 are both comprised of a plurality of round holes.

The lower limit of the diameter of the round holes is preferably 0.3 mm and more preferably 0.5 mm. The upper limit of the diameter of the round holes is preferably 10 mm and more preferably 5 mm. Use of a diameter of the round holes that is less than the lower limit may create a risk of an insufficient fracture preventive effect. Conversely, use of a diameter of the round holes that exceeds the upper limit may create a risk that the strength of the reinforcement plate 14a is insufficient.

The lower limit of the average interval between the round holes (i.e., the average distance between the centers of the round holes) in the width direction of the reinforcement member 14 is preferably 0.4 mm and more preferably 0.6 mm. The upper limit of the average interval between the round holes is preferably 10 mm and more preferably 5 mm. Use of an average interval between the round holes that is less than the lower limit may create a risk of insufficient strength of the reinforcement plate 14a. Conversely, use of an average interval between the round holes that exceeds the upper limit may create a risk of an insufficient fracture preventive effect.

The number of round holes in either set of the first hollow holes 23 or the second hollow holes 24 may properly be determined in accordance with the size of the flexible printed circuit board 2 and the stress applied thereto. The lower limit of the number of the round holes is preferably 2 and more preferably 3. The upper limit of the number of the round holes is preferably 50. Use of round holes fewer than the lower limit number may create a risk of an insufficient fracture preventive effect. Conversely, use of round holes more than the upper limit number may create a risk that the strength of the reinforcement plate 14a is insufficient.

All the round holes provided as the first hollow holes 23 and as the second hollow holes 24 preferably have the same diameter. Use of the same diameter for all the round holes allows stress to be effectively dispersed.

The number of round holes in either set of the first hollow holes 23 or the second hollow holes 24 may be determined such that the stiffness gradually increases toward the one end edge of the base film 11. As was described in connection with the first embodiment, the case in which the number of round holes is greater in the first hollow holes 23, the case in which the number of round holes is greater in the second hollow holes 24, or the case in which both sets have the same number of round holes may all be viable, depending on the width, stiffness, and the like of the base film 11.

<Advantage>

Implementing the aligning hollow holes as a plurality of round holes in the flexible printed circuit board 2 effectively disperses stress while reducing the likelihood of weakening the reinforcement member 14.

Other Embodiments

The embodiments disclosed herein should be regarded as examples only and as non-limiting in all aspects. The scope of the present invention is defined by the claims without being limited to the configurations of the disclosed embodiments, and is intended to include all modifications within the spirit and equivalents of the scope of the claims.

The embodiments have been described with reference to a case in which two lines of hollow holes are provided. The number of hollow hole lines may alternatively be one, or may alternatively be three or more. It may be noted that an increase in the number of hollow hole lines serves to improve the function to disperse stress evenly. On the other hand, an increase in the number of hollow hole lines within a limited area of the reinforcement member necessitates a decrease in the area of hollow holes in one line, which results in a tendency that the stress dispersion effect is reduced. Due to the trade-off relationships described above, the upper limit of the number of hollow hole lines is preferably 5 lines.

The first embodiment has been described with reference to a case in which the hollow holes are each an oblong shape having rounded opposite ends. The shape of hollow holes is not limited to this, and may alternatively be a circular shape of an ellipse shape. Further, the rounding of the opposite ends of the hollow holes is not essential, and a simple oblong shape may suffice. The second embodiment has been described with reference to a case in which the hollow holes are a plurality of round holes. The shape of holes is not limited to a round shape, and may alternatively be a polygonal shape such as a triangular shape or a rectangular shape. The corners of the polygonal shape may optionally be rounded.

In these embodiments, two lines of hollow holes have the same or similar shape. Alternatively, the shape may differ from line to line.

Figure 4:
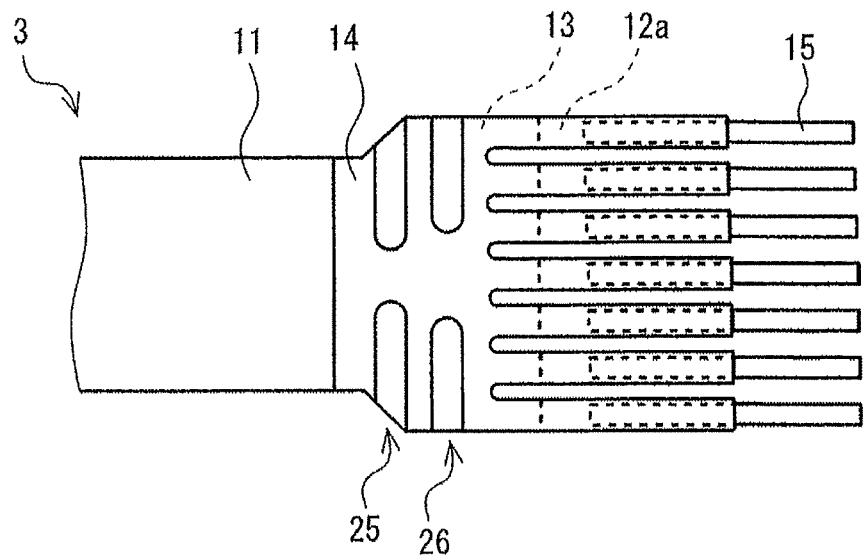
FIG. 4 is a schematic back-side view of a flexible printed circuit board according to an embodiment different from FIG. 1 and FIG. 3.

In the embodiments, the hollow holes are made by perforating the reinforcement member. It may be noted that the present invention is also intended to include a flexible printed circuit board having hollow holes continuing from edges of a reinforcement member. One example of such a configuration may be a flexible printed circuit board 3 illustrated in FIG. 4, in which a first hollow hole 25 and a second hollow hole 26 are a pair of holes made by making a cut into the reinforcement plate 14a from edges of the reinforcement plate 14a such that the cut has an oblong shape with a rounded far end. Use of the hollow holes continuing from edges of a reinforcement member allows the hollow holes to be more easily made than in the case of punching.

The embodiments have been described with reference to a case in which hollow holes penetrate through the reinforcement member. The hollow holes may alternatively be not penetrating. Non-penetrating hollow holes may still provide a stress dispersion effect. An example of the configuration in which hollow holes do not penetrate a reinforcement member may include a configuration in which the reinforcement member is comprised of two laminated reinforcement layers including an inner layer and an outer layer, and only the inner layer has the hollow holes. With such a configuration, the outer layer may prevent the reinforcement member from having an irregular surface due to the presence of hollow holes while the hollow holes of the inner layer provides a stress dispersion effect.

Figure 5:
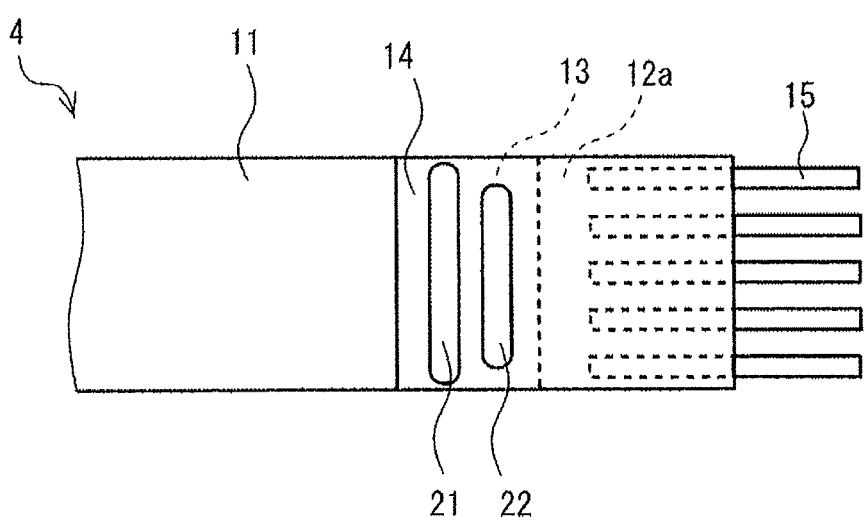
FIG. 5 is a schematic back-side view of a flexible printed circuit board according to an embodiment different from FIG. 1, FIG. 3, and FIG. 4.

The above-described embodiment has been directed to a case in which the terminal connecting area has a comb shape, but the shape of the terminal connecting area is not limited to a comb shape. For example, the terminal connecting area 12a may have a rectangular shape in a plan view as in a flexible printed circuit board 4 illustrated in FIG. 5. FIG. illustrates a case in which the width of, the terminal connecting area 12a is equal to the width of that part of the base film 11 which is other than the terminal connecting area 12a. In the case in which there is not a sufficient area for the connection terminals 15, for example, the width of the base film 11 on the one end edge may be expanded as in the case of the flexible printed circuit board 1 illustrated in FIG. 1.

Although the above-noted embodiments have been directed to as case in which a flexible printed circuit board is provided with a coverlay, the coverlay is not an essential component and may be omitted. Alternatively, an insulating layer of another configuration may be used to coat one surface of the base film or the conductive pattern, for example.

Although the above-noted embodiments have been directed to as case in which a flexible printed circuit board is provided with connection terminals, the connection terminals are not an essential component and may be omitted. A flexible printed circuit board having no connection terminals may be directly bonded to another flexible printed circuit board for connection to another electronic device, for example.

DESCRIPTION OF REFERENCE SYMBOLS 1, 2, 3, 4 flexible printed circuit board
11 base film 12 conductive pattern
12a terminal connecting area
13 coverlay
14 reinforcement member
14a reinforcement plate
15 connection terminals
21, 23, 25 first hollow hole(s)
22, 24, 26 second hollow hole(s)

What is claimed is:

1. A flexible printed circuit board which includes a base film having an insulating property and a conductive pattern laminated on one surface of the base film, and has a terminal connecting area toward one end edge of the conductive pattern, the flexible printed circuit board comprising:
a reinforcement member laminated on an opposite surface of the base film, the reinforcement member including one or more portions that overlap an entirety of the terminal connecting area in a plan view normal to the opposite surface of the base film,
wherein the reinforcement member has one or more lines of hollow holes aligning with a width direction thereof, and the hollow holes do not overlap the terminal connecting area in the plan view normal to the opposite surface of the base film, and
wherein the reinforcement member has two lines of hollow holes which include first hollow holes and second hollow holes disposed alongside the first hollow holes toward the one end edge.

2. The flexible printed circuit board as claimed in claim 1, wherein a value obtained by dividing an area of a smaller area hollow hole by an area of a larger area hollow hole, among the first hollow holes and the second hollow holes, is greater than or equal to a factor of 0.3 or less than or equal to a factor of LO.

3. The flexible printed circuit board as claimed in claim 1, wherein an average separation distance between the first hollow holes and the second hollow holes is greater than or equal to 0.5 mm and less than or equal to 10 mm.

4. The flexible printed circuit board as claimed in claim 1, comprising one or more connection terminals on the terminal connecting area,
wherein the connection terminals are made of metal.

5. A flexible printed circuit board which includes a base film having an insulating property and a conductive pattern laminated on one surface of the base film, and has a terminal connecting area toward one end edge of the conductive pattern, the flexible printed circuit board comprising:
a reinforcement member laminated on an opposite surface of the base film, the reinforcement member including one or more portions that overlap an entirety of the terminal connecting area in a plan view normal to the opposite surface of the base film,
wherein the reinforcement member has one or more lines of hollow holes aligning with a width direction thereof, and the hollow holes do not overlap the terminal connecting area in the plan view normal to the opposite surface of the base film,
wherein the aligning hollow holes are configured as a plurality of round holes, and
wherein the reinforcement member has two lines of hollow holes which include first hollow holes and second hollow holes disposed alongside the first hollow holes toward the one end edge.

* * * * *